US008897724B2

(12) United States Patent
Hou (10) Patent No.: US 8,897,724 B2
(45) Date of Patent: Nov. 25, 2014

(54) METHOD FOR CONTROLLING FAST TRACKING POWER SUPPLY, FAST TRACKING POWER SUPPLY, AND SYSTEM

(71) Applicant: Huawei Technologies Co., Ltd., Shenzhen (CN)

(72) Inventor: Zhaozheng Hou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 15 days.

(21) Appl. No.: 13/686,676

(22) Filed: Nov. 27, 2012

(65) Prior Publication Data

US 2013/0078939 A1 Mar. 28, 2013

Related U.S. Application Data

(63) Continuation of application No. PCT/CN2011/071365, filed on Feb. 28, 2011.

(30) Foreign Application Priority Data

May 31, 2010 (CN) .......................... 2010 1 0188621

(51) Int. Cl.
| | | |
|---|---|---|
| *H01Q 11/12* | (2006.01) | |
| *H04B 1/04* | (2006.01) | |
| *H04B 1/16* | (2006.01) | |
| *H03F 1/02* | (2006.01) | |
| *G05F 1/10* | (2006.01) | |
| *H03F 3/19* | (2006.01) | |
| *H03F 3/24* | (2006.01) | |

(52) U.S. Cl.
CPC .............. *H04B 1/1607* (2013.01); *H03F 1/025* (2013.01); *G05F 1/10* (2013.01); *H03F 1/0227* (2013.01); *H03F 3/19* (2013.01); *H03F 3/245* (2013.01); *H03F 2200/507* (2013.01); *H03F 2200/511* (2013.01); *H03F 2200/102* (2013.01); *H03F 2200/432* (2013.01)
USPC ........................................ 455/91; 455/127.1

(58) Field of Classification Search
CPC .............................. H03G 3/3042; H03F 3/24
USPC .................................................. 455/91, 127.1
See application file for complete search history.

(56) References Cited

U.S. PATENT DOCUMENTS 5,736,878 A 4/1998 McLeod
5,905,407 A * 5/1999 Midya ............................ 330/10
(Continued)

FOREIGN PATENT DOCUMENTS

CN 1790920 A 6/2006
CN 200944197 Y 9/2007
(Continued)

OTHER PUBLICATIONS

Written Opinion of the International Searching Authority issued in corresponding PCT Patent Application No. PCT/CN2011/071365, mailed Jun. 9, 2011.

(Continued)

*Primary Examiner* — Simon Nguyen
(74) *Attorney, Agent, or Firm* — Brinks Gilson & Lione (57) ABSTRACT

A fast tracking power supply includes a combined controllable voltage source to control a load voltage. The combined controllable voltage source is connected to a tracking current source in parallel to provide a current for a load. The tracking current source is responsible for providing a low-frequency high current for the load to implement high-efficiency low-frequency tracking of the load current and reducing an output current of the combined controllable voltage source as much as possible. Meanwhile, a power supply voltage switching unit in the combined controllable voltage source adjusts a power supply voltage range of a linear amplifier in the combined controllable voltage source, so as to reduce the power supply voltage range of the linear amplifier, thereby reducing power consumption of the combined controllable voltage source.

20 Claims, 8 Drawing Sheets

(56) References Cited

U.S. PATENT DOCUMENTS

| | | | |
|---|---|---|---|
| 7,207,054 B1* | 4/2007 | Richards et al. | 725/72 |
| 7,538,631 B2* | 5/2009 | Immonen et al. | 332/149 |
| 7,653,366 B2* | 1/2010 | Grigore | 455/127.1 |
| 7,679,433 B1* | 3/2010 | Li | 330/10 |
| 7,755,431 B2* | 7/2010 | Sun | 330/297 |
| 7,764,055 B2* | 7/2010 | Rozenblit et al. | 323/282 |
| 7,808,323 B2* | 10/2010 | Takinami et al. | 330/297 |
| 8,098,093 B1* | 1/2012 | Li | 330/127 |
| 8,571,492 B2* | 10/2013 | Berchtold et al. | 455/91 |
| 8,587,271 B2* | 11/2013 | Kanbe et al. | 323/272 |
| 2003/0146791 A1 | 8/2003 | Shvarts et al. | |
| 2006/0028271 A1* | 2/2006 | Wilson | 330/199 |
| 2006/0209984 A1 | 9/2006 | Kenington | |
| 2007/0281635 A1* | 12/2007 | McCallister et al. | 455/126 |
| 2008/0157895 A1 | 7/2008 | Immonen et al. | |
| 2008/0278136 A1 | 11/2008 | Murtojarvi | |
| 2009/0191826 A1 | 7/2009 | Takinami et al. | |
| 2013/0300508 A1* | 11/2013 | Lesso | 330/296 |

FOREIGN PATENT DOCUMENTS

| | | |
|---|---|---|
| CN | 101588125 A | 11/2009 |
| CN | 101689806 A | 3/2010 |
| CN | 101867284 A | 10/2010 |

OTHER PUBLICATIONS

Chinese Patent No. 101867284, issued on Nov. 21, 2012, granted in corresponding Chinese Patent Application No. 201010188621.9.

Extended European Search Report issued in corresponding European Patent Application No. 11789082.2, mailed Feb. 14, 2013.

Office Action issued in corresponding Chinese Patent Application No. 201010188621.9, mailed Feb. 22, 2012.

International Search Report issued in corresponding PCT Patent Application No. PCT/CN2011/071365, mailed Jun. 9, 2011.

* cited by examiner

METHOD FOR CONTROLLING FAST TRACKING POWER SUPPLY, FAST TRACKING POWER SUPPLY, AND SYSTEM

CROSS-REFERENCE TO RELATED APPLICATIONS

This application is a continuation of International Application No. PCT/CN2011/071365, filed on Feb. 28, 2011, which claims priority to Chinese Patent Application No. 201010188621.9, filed on May 31, 2010, both of which are hereby incorporated by reference in their entireties.

FIELD OF THE APPLICATION

The present application relates to the field of communications technologies, and in particular to a method for controlling a fast tracking power supply, a fast tracking power supply, and a system.

BACKGROUND OF THE APPLICATION

To fully utilize a spectrum, current radio communication systems such as a Code Division Multiple Address (CDMA, Code Division Multiple Address), a Wideband Code Division Multiple Address (WCDMA, Wideband Code Division Multiple Address), a Universal Mobile Telecommunication System (UMTS, Universal Mobile Telecommunication System), a Next Generation Network (LTE, Long Term Evolution) and other networks generally adopt variable envelope modulation technologies capable of performing amplitude modulation and phase modulation at the same time.

Figure 1A:
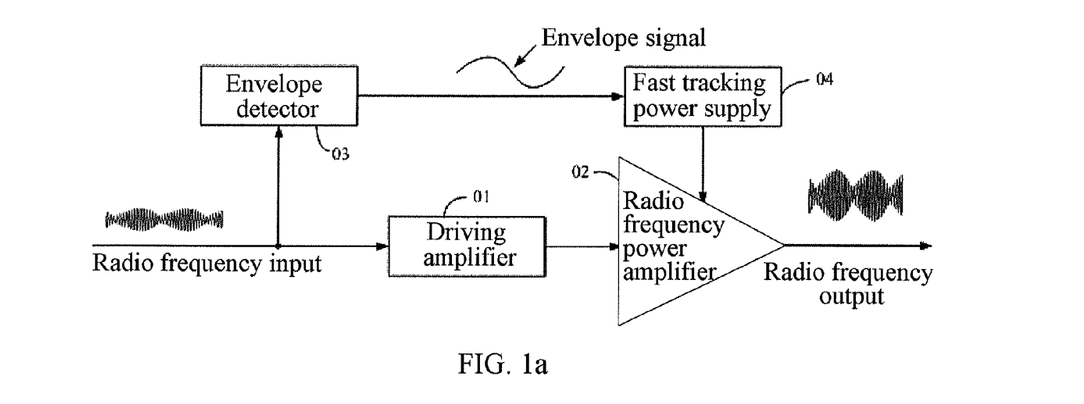
FIG. 1a is a schematic structural diagram of a variable envelope modulation system in the prior art.

The variable envelope modulation technologies need to use a linear amplifier to amplify a signal, which is generally implemented by using a technology based on Envelope Tracking (ET, Envelope Tracking) to ensure linearity and improve power amplification efficiency. As shown in FIG. 1a, after a radio frequency signal is input, a driving amplifier 01 performs driving amplification on the radio frequency signal, and then outputs the radio frequency signal to a radio frequency power amplifier 02; meanwhile, an envelope detector 03 extracts an envelope signal of the radio frequency signal, and a fast tracking power supply 04 amplifies the envelope signal, where the amplified envelope signal is used as a drain voltage of the radio frequency power amplifier; and finally the radio frequency power amplifier 02 outputs the amplified radio frequency signal.

Figure 1B:
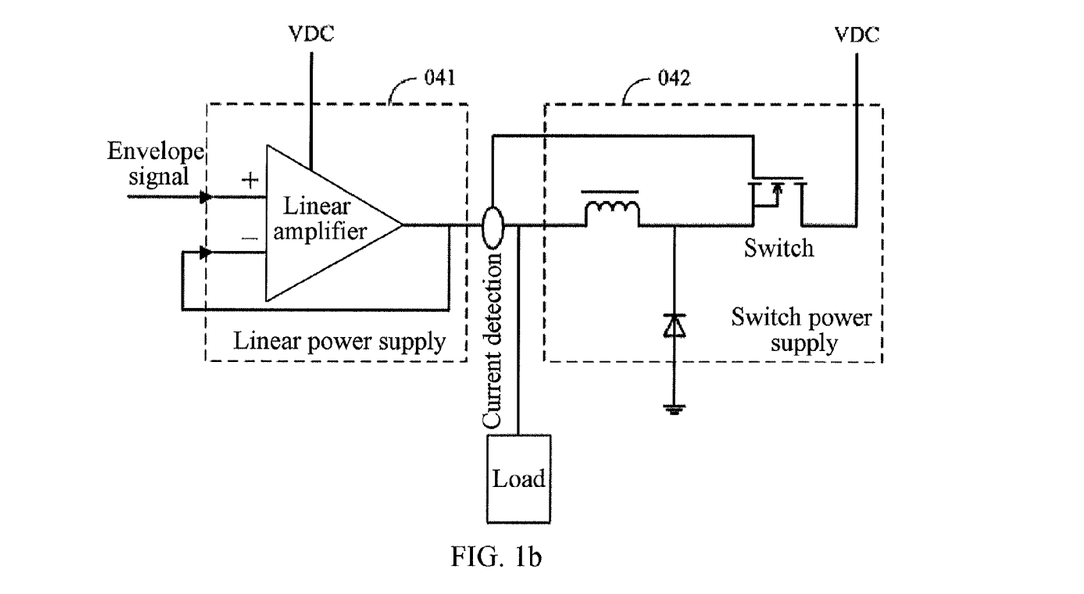
FIG. 1b is a schematic structural diagram of a fast tracking power supply in the prior art.

With the development of multi-carrier technologies, the requirements on the bandwidth and efficiency of the fast tracking power supply are increasingly high, and it is difficult to meet the requirements by using a common switch power supply as the fast tracking power supply. Therefore, the prior art provides a novel fast tracking power supply. Referring to FIG. 1b, in the solution, a power supply is divided into two parts: a linear power supply 041 and a switch power supply 042. The linear power supply 041 and the switch power supply 042 are connected in parallel at an output end, and supply power for radio frequency power amplification together. The linear power supply 041 outputs high-frequency power, and the switch power supply 042 outputs low-frequency power. The linear power supply 041 is a voltage source and uses a voltage closed loop to track a high-frequency envelope signal. The switch power supply 042 is a low-frequency current source and uses a current closed loop to detect an output current of the linear power supply 041 and adjust an output current of itself (that is, the switch power supply 042) according to the output current of the linear power supply 041, so that the output current of the linear power supply 041 is as low as possible. In the solution, it is ensured that the output has low distortion through the linear power supply 041, and the whole efficiency is improved through the switch power supply 042.

During the research and implementation of the prior art, the inventors find that the whole power amplification efficiency of the fast tracking power supply in the solution is low.

SUMMARY OF THE APPLICATION

The embodiments below provide a method for controlling a fast tracking power supply, a fast tracking power supply, and a system, which may improve the whole power amplification efficiency.

A fast tracking power supply includes a combined controllable voltage source, a current detection unit and a tracking current source, where the combined controllable voltage source includes a linear amplifier and a power supply voltage switching unit.

The linear amplifier is configured to receive a first control signal extracted from a reference signal, and control a load voltage according to the received first control signal.

The power supply voltage switching unit is configured to receive a second control signal extracted from the reference signal, and provide different power supply voltage combinations for the linear amplifier according to the received second control signal.

The current detection unit is configured to detect an output current of the combined controllable voltage source, and output a third control signal according to a detection result.

The tracking current source is configured to receive the third control signal output by the current detection unit, and adjust an output current of the tracking current source according to the third control signal, so as to implement high-efficiency low-frequency tracking of a load current.

The combined controllable voltage source is connected to the current detection unit in series and then connected to the tracking current source in parallel, to provide a current for a load.

A communication system includes an envelope detector, a driving amplifier, a radio frequency power amplifier and any one of the fast tracking power supplies provided by the embodiment.

The envelope detector is configured to detect a radio frequency signal, extract an envelope signal from the radio frequency signal, use the envelope signal as a reference signal, and provide the reference signal for a fast tracking power supply.

The fast tracking power supply is configured to receive the envelope signal extracted by the envelope detector, and provide a drain voltage and current for the radio frequency power amplifier according to the envelope signal.

The driving amplifier is configured to receive the radio frequency signal, and perform driving amplification on the radio frequency signal.

The radio frequency power amplifier is configured to receive the radio frequency signal that has undergone the driving amplification performed by the driving amplifier and amplify the radio frequency signal.

A method for controlling a fast tracking power supply, comprising:

receiving a second control signal extracted from a reference signal, and providing different power supply voltage combinations for a linear amplifier in a combined controllable voltage source according to the second control signal;

receiving a first control signal extracted from the reference signal, and providing a voltage for a load according to the received first control signal under the effect of the voltage combinations;

detecting an output current of the combined controllable voltage source, and outputting a third control signal according to detection conditions; and adjusting an output current of a tracking current source according to the third control signal, so as to implement high-efficiency low-frequency tracking of a load current.

The fast tracking power supply according to the embodiments adopts the combined controllable voltage source to provide the voltage for the load, and the combined controllable voltage source is connected to the tracking current source in parallel to provide the current for the load. The tracking current source is responsible for providing a low-frequency high current for the load to implement high-efficiency low-frequency tracking of the load current and reducing the output current of the combined controllable voltage source as much as possible. Meanwhile, the power supply voltage switching unit in the combined controllable voltage source adjusts a power supply voltage range of the linear amplifier in the combined controllable voltage source, so as to reduce the power supply voltage range of the linear amplifier, thereby reducing power consumption of the combined controllable voltage source. Moreover, because the power supply voltage range of the linear amplifier is reduced, the linear amplifier may further implement a higher tracking bandwidth, which may improve the whole power amplification efficiency of the fast tracking power supply.

BRIEF DESCRIPTION OF THE DRAWINGS

To illustrate the technical solutions according to the embodiments or in the prior art more clearly, the accompanying drawings for describing the embodiments or the prior art are introduced briefly in the following. Apparently, the accompanying drawings in the following description are only some embodiments, and persons of ordinary skill in the art can derive other drawings from the accompanying drawings without creative efforts.

DETAILED DESCRIPTION OF THE EMBODIMENTS

The described technical solutions are better understood with reference to the accompanying drawings. The embodiments described below are merely exemplary Embodiments provide a method for controlling a fast tracking power supply, a fast tracking power supply and a system, which are described in detail in the following.

Embodiment 1

Figure 2:
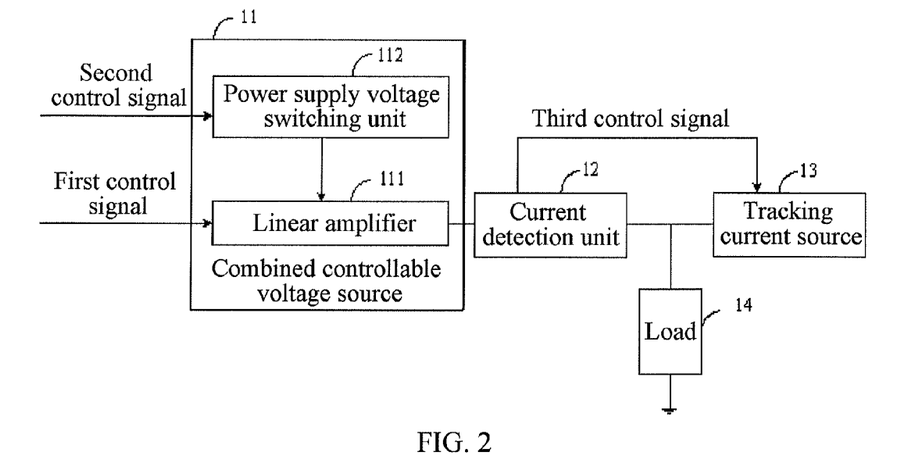
FIG. 2 is a schematic structural diagram of a fast tracking power supply according to Embodiment 1.

A fast tracking power supply is provided. Referring to FIG. 2, the fast tracking power supply includes a combined controllable voltage source 11, a current detection unit 12 and a tracking current source 13. The combined controllable voltage source 11 includes a linear amplifier 111 and a power supply voltage switching unit 112.

The linear amplifier 111 is configured to receive a first control signal extracted from a reference signal and provide a voltage for a load 14 according to the received first control signal. The linear amplifier 111 may adopt an amplifier with a push-pull (Push-Pull) structure, and may be a linear amplifier of class A (ClassA), class B (ClassB), or class AB (ClassAB).

The power supply voltage switching unit 112 is configured to receive a second control signal extracted from the reference signal, and provide different power supply voltage combinations for the linear amplifier 111 according to the received second control signal. In this way, a power supply voltage range of the linear amplifier 111 is not required to cover a whole voltage range, but maintains within a small power supply voltage range. Because a current provided by the linear amplifier occupies a small proportion of a load current, if the covered power supply voltage range is reduced at the same time, power consumed by the linear amplifier is also reduced, that is, the power consumption of a high-precision low-efficiency part of the combined controllable voltage source is reduced and the efficiency of the whole device is improved.

The current detection unit 12 is configured to detect an output current of the combined controllable voltage source 11, and output a third control signal according to detection conditions.

The tracking current source 13 is configured to receive the third control signal output by the current detection unit 12, and adjust an output current of the tracking current source 13 according to the third control signal, so as to implement high-efficiency low-frequency tracking of the load current. The tracking current source may be specifically formed by a BUCK (BUCK) circuit, a BOOST (BOOST) circuit, a BUCK-BOOST (BUCK-BOOST) circuit, or a CUK (CUK) circuit.

The combined controllable voltage source 11 is connected to the current detection unit 12 in series and then connected to the tracking current source 13 in parallel, to provide a current for the load 14. Because the tracking current source 13 has a feature of high efficiency and low precision, while the linear amplifier 111 has a feature of low efficiency and high precision, in order to improve the whole efficiency of the fast tracking power supply, the tracking current source 13 provides a large part of a low-frequency current in the load current, so as to implement high-efficiency low-frequency tracking of the load current. The combined controllable voltage source 11 outputs a low current that is equal to a difference of the load current and the output current of the tracking current source 13, for example, if the load current is Io, and the output current of the tracking current source 13 is I1, the output current of the combined controllable voltage source 11 is Io-I1.

It can be seen from the above that, the fast tracking power supply of this embodiment adopts the combined controllable voltage source 11 to provide the voltage for the load 14, and the combined controllable voltage source 11 is connected to the current detection unit 12 in series and then connected to the tracking current source 13 in parallel to provide the current for the load. The tracking current source 13 is responsible for providing a low-frequency high current for the load 14 to implement high-efficiency low-frequency tracking of the load current and reducing the output current of the combined controllable voltage source 11 as much as possible. Meanwhile, the power supply voltage switching unit 112 in the combined controllable voltage source 11 adjusts a power supply voltage range of the linear amplifier 111 in the combined controllable voltage source 11, so as to reduce the power supply voltage range of the linear amplifier 111, thereby reducing power consumption of the combined controllable voltage source 11. Moreover, because the power supply voltage range of the linear amplifier 111 is reduced, the linear amplifier 111 may further implement a higher tracking bandwidth, which may improve the whole power amplification efficiency of the fast tracking power supply.

Embodiment 2

According to the fast tracking power supply described in Embodiment 1, the power supply voltage switching unit 112 may include a level selection branch and at least two voltage sources with different voltage values, which are described as follows:

A voltage source is configured to provide a voltage, and may be implemented in multiple forms according to requirements in actual applications.

The level selection branch is configured to receive a second control signal, and select a voltage source according to the received second control signal, so as to provide a power supply voltage for the linear amplifier 111.

The level selection branch is formed by devices such as a driving device, a switch device and a diode.

The driving device is configured to receive the second control signal, select a voltage source according to the received second control signal, and drive the switch device to perform switching. Specifically, a bootstrap driving device or an isolation driving device may be used, for example, a drive 1 (DRV1, Driver1), DRV2 or DRV3 may be used.

The switch device is configured to perform the switching among the voltage sources, and may be a device, such as specifically a high-speed metal-oxide-semiconductor field-effect transistor (MOSFET, Metal-Oxide-Semiconductor Field-Effect Transistor), and a triode.

The diode is configured to prevent straight-through among different voltages and provide reverse prevention.

It should be noted that, a specific implementation circuit of the level selection branch is not limited, and the level selection branch may be implemented by using different circuits according to specific constituting devices. The level selection branch switches and selects different voltage sources and then outputs a step-like voltage to supply power for the linear amplifier.

The current detection unit 12 is specifically configured to detect an output current of the combined controllable voltage source 11, when detecting that the output current of the combined controllable voltage source 11 is increased, output a third control signal instructing to increase the output current of the tracking current source 13; and when detecting that the output current of the combined controllable voltage source 11 is decreased, output a third control signal instructing to reduce the output current of the tracking current source 13.

At this time, the tracking current source 13 is specifically configured to increase the output current of the tracking current source 13 when receiving the third control signal instructing to increase the output current of the tracking current source 13 and output by the current detection unit 12, and reduce the output current of the tracking current source 13 when receiving the third control signal instructing to reduce the output current of the tracking current source 13 and output by the current detection unit 12.

Figure 3:
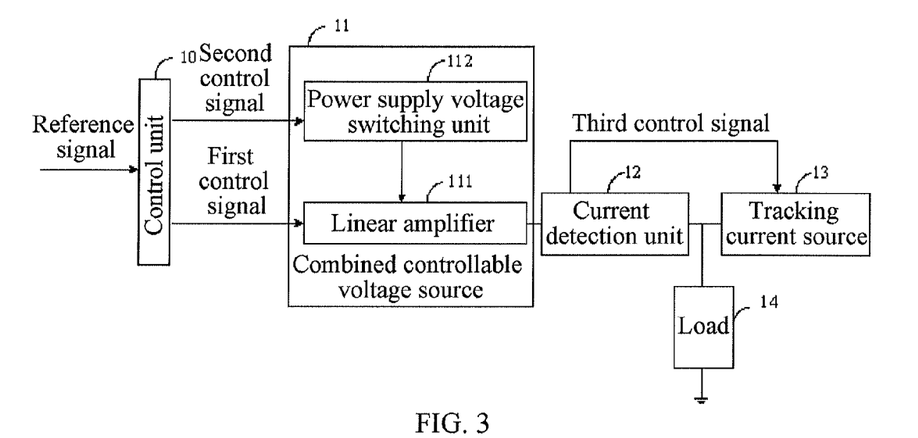
FIG. 3 is a schematic structural diagram of a fast tracking power supply according to Embodiment 2.

Further, referring to FIG. 3, the fast tracking power supply may further include a control unit 10.

The control unit 10 is configured to receive a reference signal, output a first control signal to the power supply voltage switching unit 112 and output a second control signal to the linear amplifier 111 according to the reference signal.

The reference signal is an envelope signal sent by an envelope detector. Because the voltage and power of the envelope signal are generally low, it is required to amplify the voltage and power of the envelope signal through the fast tracking power supply device in the embodiments, and then the amplified envelope signal is used as a drain voltage of a radio frequency power amplifier, which is not described in detail herein again. For details, refer to the prior art. The envelope signal used as the reference signal may be specifically an analog signal or a digital signal.

After receiving the reference signal, the control unit 10 outputs a first control signal to the power supply voltage switching unit 112, and outputs a second control signal to the linear amplifier 111. To ensure that each unit outputs the signals that match with other in the aspect of time so as to obtain correct output signals after superposition, the control unit 10 may further perform delay matching on the first control signal and the second control signal.

During specific implementation, the control unit 10 may be a digital signal processing (DSP, Digital Signal Processing) or a field programmable gate array (FPGA, Field Programmable Gate Array) processing chip or other processing units with similar functions.

It can be seen from the above that, the fast tracking power supply of this embodiment uses the combined controllable voltage source 11 to provide the voltage for the load, and the combined controllable voltage source 11 is connected to the current detection unit 12 in series and then connected to the tracking current source 13 in parallel to provide the current for the load. The tracking current source 13 with the feature of high efficiency and low precision is responsible for providing a large part of the current in the load current to implement high-efficiency low-frequency tracking of the load current and reducing the output current of the combined controllable voltage source 11 (that is, reducing the output current of the linear amplifier 111) as much as possible, so as to reduce the output power of the linear amplifier 111 with the feature of low efficiency and high precision. Therefore, the power consumption is reduced because of the low output efficiency of the linear amplifier 111 (because the linear amplifier 111 is a device with the feature of low efficiency and high precision), thereby improving the whole switching efficiency of the fast tracking power supply.

Meanwhile, the power supply voltage switching unit 112 in the combined controllable voltage source 11 adjusts the power supply voltage range of the linear amplifier 111 in the combined controllable voltage source 11, so as to reduce the power supply voltage range of the linear amplifier 111 and further reduce the power consumption of the combined controllable voltage source 11. Moreover, because the power supply voltage range of the linear amplifier 111 is reduced, the linear amplifier 111 may further implement a higher tracking bandwidth.

To sum up, through the solution, the whole power amplification efficiency of the fast tracking power supply is improved at the same time when it is ensured to output a high-bandwidth and high-precision signal.

Embodiment 3

According to the fast tracking power supply described in Embodiment 1 and Embodiment 2, the following takes an example for further detailed description.

Figure 4:
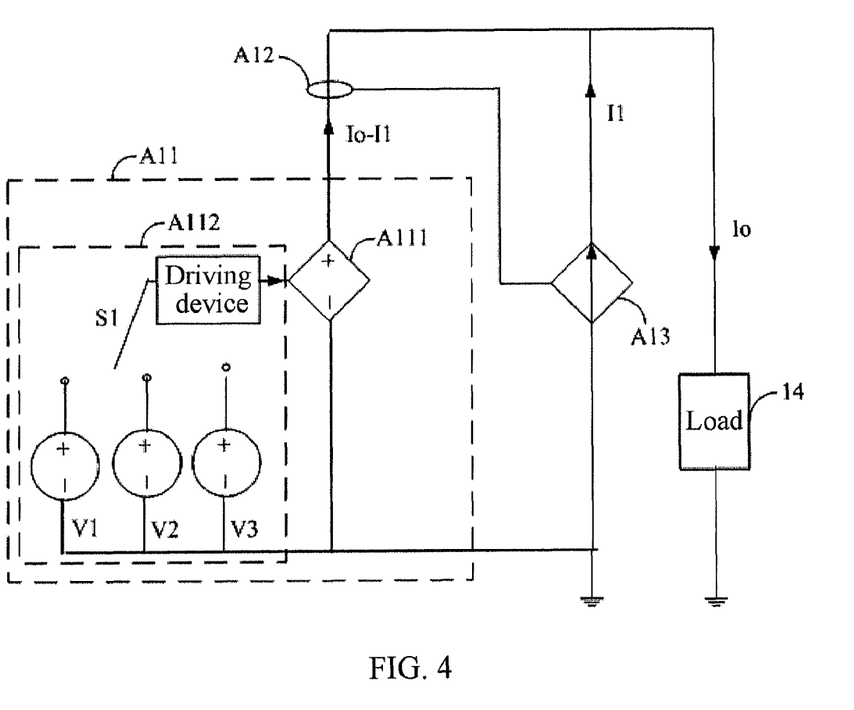
FIG. 4 is an equivalent circuit diagram of a fast tracking power supply according to Embodiment 3.

FIG. 4 shows an equivalent circuit of the fast tracking power supply, which includes a combined controllable voltage source A11, a current detection unit A12 and a tracking current source A13. The combined controllable voltage source A11 is connected to the current detection unit A12 in series and then connected to the tracking current source A13 in parallel.

The combined controllable voltage source A11 is equivalent to the combined controllable voltage source 11 in FIG. 3, and may include a controllable voltage source A111, a driving device, a switch S1 and three voltage sources: V1, V2 and V3.

The controllable voltage source A111 is equivalent to the linear amplifier 111 in FIG. 3, and is configured to receive a first control signal extracted from a reference signal and provide a voltage for a load 14 according to the received first control signal.

A portion A112 formed by the switch S1, the driving device and a voltage source is equivalent to the power supply voltage switching unit 112 in FIG. 3, and is configured to receive a second control signal extracted from the reference signal and provide different power supply voltage combinations for the controllable voltage source A111 according to the received second control signal.

The switching may be implemented through the switch S1. For example, when the switch S1 is connected to the voltage source V1, a voltage value output to the controllable voltage source A111 (that is, the linear amplifier 111) is V1; and when the switch S1 is connected to the voltage source V2, a voltage value output to the controllable voltage source A111 is V2. The switch S1 may be specifically a device such as a high-speed MOSFET or a triode.

Definitely, in order to drive the switch S1 to switch, a corresponding driving device is required. For example, referring to a driving device in FIG. 4, the driving device is mainly configured to receive the second control signal, select a voltage source according to the received second control signal, and drive the switch S1 to switch. According to conditions in actual applications, the driving device may adopt a bootstrap driving device or an isolation driving device.

The current detection unit A12 is equivalent to the current detection unit 12 in FIG. 3, and is configured to detect the output current "I1-Io" of the combined controllable voltage source A11 and output a third control signal according to the detection conditions. For example, when detecting that the output current "I1-Io" of the combined controllable voltage source 11 is increased, the current detection unit A12 outputs a third control signal instructing to increase the output current I1 of the tracking current source 13; and when detecting that the output current "I1-Io" of the combined controllable voltage source 11 is decreased, the current detection unit A12 outputs a third control signal instructing to reduce the output current I1 of the tracking current source 13.

The tracking current source A13 is equivalent to the tracking current source 13 in FIG. 3, and is configured to receive the third control signal output by the current detection unit 12 and adjust the output current I1 of the tracking current source 13 according to the third control signal, so as to implement high-efficiency low-frequency tracking of the load current Io. For example, if the received third control signal indicates to increase the output current I1 of the tracking current source 13, the tracking current source A13 increases the output current I1 of the tracking current source 13; and if the received third control signal indicates to reduce the output current I1 of the tracking current source 13, the tracking current source A13 reduces the output current I1 of the tracking current source 13.

Definitely, the circuit of the fast tracking power supply may further include a control unit 10, which is not described in detail herein again. For details, refer to Embodiment 2.

In addition, it should be noted that, in this embodiment, that three voltage sources are switched is taken as an example for description. In the actual application, the number of the voltage sources and the number of the switches may be adjusted according to actual requirements.

It can be seen from the above that, the fast tracking power supply of this embodiment uses the combined controllable voltage source A11 to provide the voltage for the load, and the combined controllable voltage source A11 is connected to the current detection unit A12 in series and then connected to the tracking current source A13 in parallel to provide the current for the load. The first tracking current source A13 with the feature of high efficiency and low precision is responsible for providing a large part of the current in the load current to implement high-efficiency low-frequency tracking of the load current and reducing the output current of the controllable voltage source A111 as much as possible, so as to reduce the output power of the controllable voltage source A111 with the feature of low efficiency and high precision. Therefore, the power consumption is reduced because of the low output efficiency of the controllable voltage source A111, thereby improving the whole switching efficiency of the fast tracking power supply.

Meanwhile, the devices such as the driving device and the switch S1 adjust the power supply voltage range of the controllable voltage source A111, so as to reduce the power supply voltage range of the controllable voltage source A111 and further reduce the power consumption of the combined controllable voltage source A11. Moreover, because the power supply voltage range of the controllable voltage source A111 is decreased, the controllable voltage source A111 may further implement a higher tracking bandwidth.

To sum up, through the solution, the whole power amplification efficiency of the fast tracking power supply is improved at the same time when it is ensured to output a high-bandwidth and high-precision signal.

Embodiment 4

In this embodiment, another equivalent circuit of the fast tracking power supply is taken as an example for description.

Figure 5:
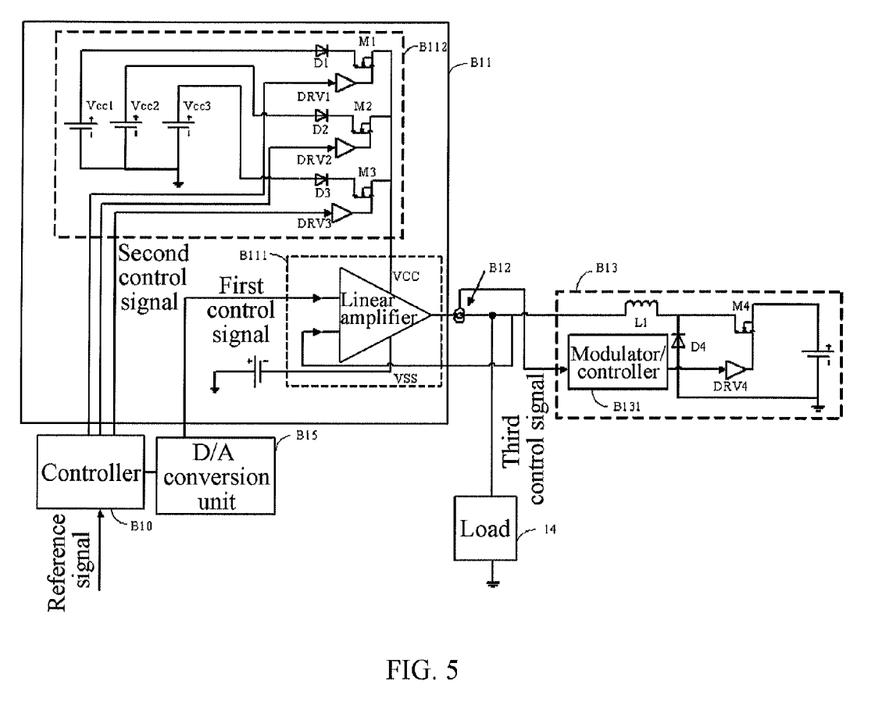
FIG. 5 is an equivalent circuit diagram of a fast tracking power supply according to Embodiment 4.

FIG. 5 shows another equivalent circuit of the fast tracking power supply, which includes a controller B10, a combined controllable voltage source B11, a current detection unit B12 and a switch tracking current source B13. The combined controllable voltage source B11 is connected to the current detection unit B12 in series and then connected to the tracking current source B13 in parallel. The combined controllable voltage source B11 is equivalent to the combined controllable voltage source 11, and is configured to control the output voltage and provide the output voltage to the load. The combined controllable voltage source B11 may include a linear amplifier B111 and a power supply voltage switching unit B112.

The controller B10 is equivalent to the control unit 10 in FIG. 3, and is configured to receive a reference signal, output a first control signal to the power supply voltage switching unit 112 and output a second control signal to the linear amplifier 111 according to the reference signal. The reference signal here is an envelope signal that has undergone detection performed by an envelope detector, and the envelope signal may be a digital signal that has undergone digitization performed by the envelope detector or an analog signal. During the procedure in which the controller B10 processes the reference signal, it is further required to perform delay matching on the first control signal and the second control signal obtained after the processing, so that a correct output signal may be obtained after the signals output by each unit are superposed at the same time.

The linear amplifier B111 is equivalent to the linear amplifier 111 in FIG. 3, and is configured to receive the first control signal sent by the controller B10 and provide a voltage for the load 14 according to the received first control signal. The linear amplifier 111 may adopt an amplifier with a Push-Pull structure, and may adopt, but not limited to, a linear amplifier of Class A, Class B, or Class AB according to actual requirements. In order to improve the tracking precision, the linear amplifier 111 may further adopt output feedback control, as shown in FIG. 5.

The power supply voltage switching unit B112 is equivalent to the power supply voltage switching unit 112 in FIG. 3, and is configured to receive the second control signal sent by the controller B10 and provide a positive power supply voltage rail-power supply level VCC for the linear amplifier B111 according to the received second control signal.

The current detection unit B12 is equivalent to the current detection unit 12 in FIG. 3, and is configured to detect the output current of the combined controllable voltage source B11 and output a third control signal according to the detection conditions. For example, when detecting that the output current of the combined controllable voltage source 11 is increased, the current detection unit B12 outputs a third control signal instructing to increase the output current of the tracking current source 13; and when detecting that the output current of the combined controllable voltage source 11 is decreased, the current detection unit B12 outputs a third control signal instructing to reduce the output current of the tracking current source 13.

The tracking current source B13 is equivalent to the tracking current source 13 in FIG. 3, and is configured to receive the third control signal output by the current detection unit B12 and adjust the output current of the tracking current source B13 according to the third control signal, so as to implement high-efficiency low-frequency tracking of the load current. For example, if the received third control signal indicates to increase the output current of the tracking current source 13, the tracking current source B13 increases the output current of the tracking current source 13; and if the received third control signal indicates to reduce the output current of the tracking current source 13, the tracking current source B13 reduces the output current of the tracking current source 13.

The power supply voltage switching unit B112 may include multiple power supply voltage switching tributaries each of which is formed by a voltage source, a diode, a MOSFET and a driving device, and each power supply voltage switching tributary has different voltage sources.

For example, referring to FIG. 5, the power supply voltage switching unit B112 has three positive power supply voltage rail-power supply levels Vcc1, Vcc2 and Vcc3, and each positive power supply voltage rail-power supply level corresponds to one power supply voltage switching tributary. In order to prevent straight-through among different levels, each power supply voltage switching tributary has one diode, referring to D1, D2 and D3 in FIG. 5. The diodes are configured to provide a function of reverse prevention. In addition, each power supply voltage switching tributary is connected to one MOSFET in series, such as M1, M2 and M3 in FIG. 5. The MOSFETs are equivalent to switch tubes and are configured to select a proper level among the positive power supply voltage rail-power supply levels Vcc1 to Vcc3 through the second control signal and provide the level for the linear amplifier B111. In order to drive the MOSFETs, each MOSFET corresponds to one driving device, for example, M1 corresponds to a driving device DRV1, M2 corresponds to a driving device DRV2, and M3 corresponds to a driving device DRV3, and the driving devices may be specifically bootstrap driving devices or isolation driving devices.

The switch tracking current source B13 may be formed by a single-channel buck circuit without output capacitance, and is configured to control on and off of a switch tube M4 through the third control signal to change the current in an inductor L1 and further to implement the control of the output current of the tracking current source B13, so as to implement high-efficiency low-frequency tracking of the load current.

The switch tracking current source B13 may further include a diode D4 and a driving device DRV4.

The diode D4 is connected to the switch tube M4 in parallel, and is configured to provide a path for continuous flow of an inductive current when the switch tube M4 is turned off.

The driving device DRV4 is configured to drive the switch tube M4 according to the third control signal.

Optionally, the switch tracking current source B13 may further include a modulator/controller B131, and the modulator/controller B131 is connected to the driving device DRV4 in series to modulate and control the received third control signal.

In the embodiment, because the input signals of the linear amplifier are all analog signals, if the received first control signal is a digital signal, digital/analog (D/A, Digital/Analog) conversion is required to convert the digital signal into an analog signal. Therefore, the fast tracking power supply may further include a D/A conversion unit B15.

The D/A conversion unit B15 is configured to convert the received first control signal from a digital signal into an analog signal, and transmit the analog signal to the linear amplifier B111.

Through switching selection for different voltage sources, the circuit may output a step-like voltage Vcc to supply power to the linear amplifier B111, that is, the output voltage is used as a drain voltage of the linear amplifier B111.

Figure 6:
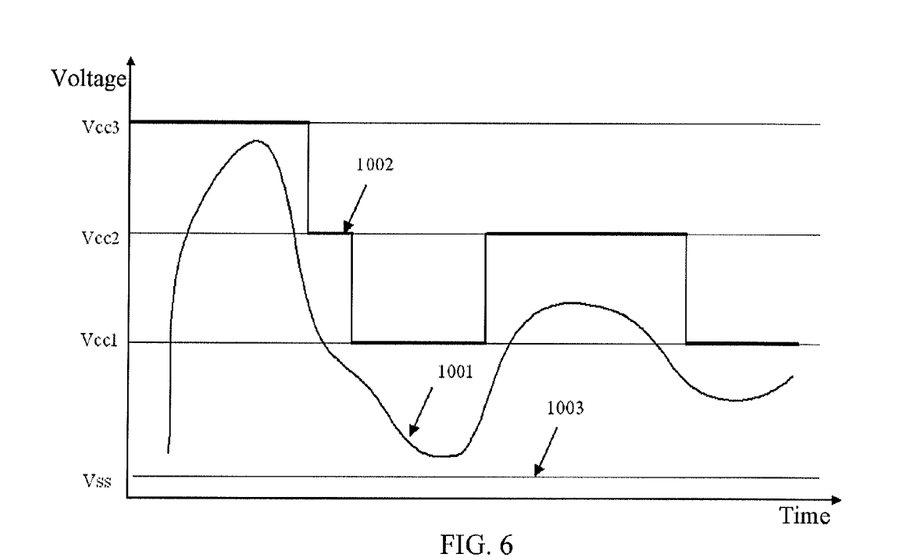
FIG. 6 is a voltage curve diagram of each unit in the fast tracking power supply according to Embodiment 4.

Referring to FIG. 6, the voltage Vcc output by the power supply voltage switching unit B112 is shown by a curve 1002, a waveform of the voltage output by the combined controllable voltage source B11 is shown by a curve 1001, and a Vss voltage (that is, a negative voltage, specifically referring to the prior art) of the linear amplifier B111 is shown by a curve 1003. It can be seen that, through the switching the voltage sources performed by the power supply voltage switching unit B112, the power supply voltage range of the linear amplifier B111 may be dynamically decreased, that is, the values of Vcc-Vss are reduced. Moreover, in the fast tracking power supply, the tracking current source B13 is mainly responsible for providing a large part of the current in the load current to implement high-efficiency low-frequency tracking of the load current, and the output current of the linear amplifier B111 is low, so that the output power of the linear amplifier B111 may be reduced, that is, the power consumption is reduced because of low output efficiency of the linear amplifier B111, thereby improving the whole switching efficiency of the fast tracking power supply.

Figure 7:
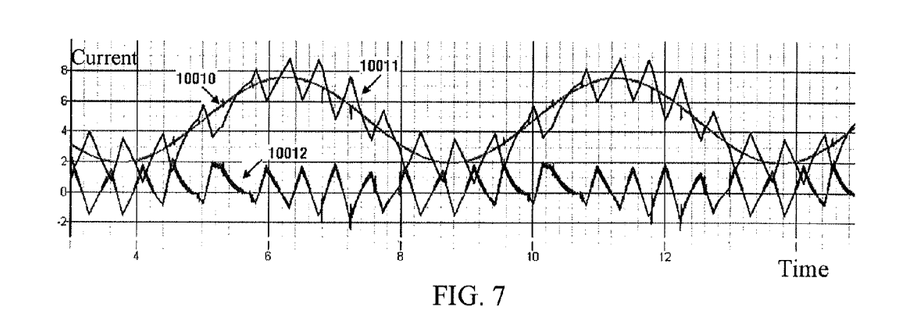
FIG. 7 is a current curve diagram of each unit in the fast tracking power supply according to Embodiment 4.

For example, referring to FIG. 7, when the reference signal is a sine wave, if the load is a resistive load, the load current may be shown by a curve 10010, the output current of the tracking current source B13 is shown by a curve 10011, and the output current of the combined controllable voltage source B11 is shown by a curve 10012. It can be seen that, the output current of the tracking current source B13 may implement high-efficiency low-frequency tracking of the load current. Moreover, because the output current of the combined controllable voltage source B11 (that is, the output current of the linear amplifier B111) is low, the solution may improve the switching efficiency of the whole device.

In addition, because the power supply voltage range of the linear amplifier B111 is decreased, the linear amplifier B111 may further implement a higher tracking bandwidth.

Embodiment 5

On the basis of the above embodiments, Vcc and Vss may be adjusted at the same time according to the requirements in an application scenario, that is, after receiving the second control signal, the power supply voltage switching unit 112 may control the values of Vcc and Vss at the same time according to the second control signal.

Figure 8:
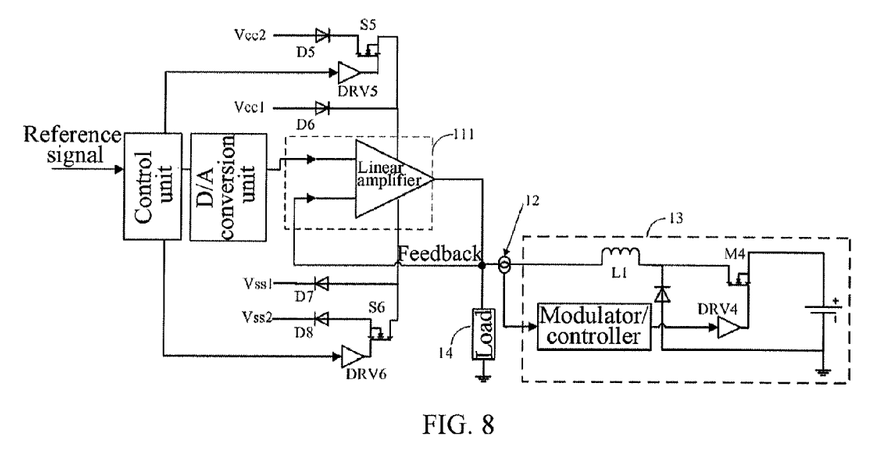
FIG. 8 is an equivalent circuit diagram of a fast tracking power supply according to Embodiment 5.

For example, referring to FIG. 8, in the fast tracking power supply, four voltage values of Vcc1, Vcc2, Vcc3 and Vcc4 are provided, that is, altogether four voltage ranges such as "Vcc1-Vss1", "Vcc1-Vss2", "Vcc2-Vss1" and "Vcc2-Vss2" are provided for the liner amplifier 111, where Vcc1 and Vcc2 are controlled by a driving device DRV5 and a switch S5, and Vss1 and Vss2 are controlled by a driving device DRV6 and a switch S6. For example, when the second control signal controls the driving device DRV5 to turn on the switch S5 and meanwhile controls the driving device DRV6 to turn on the switch S6, a power supply voltage tributary where Vcc1 is located and a power supply voltage tributary where Vss1 is located are both changed into a path, and at this time, the voltage range of the linear amplifier 111 is "Vcc1-Vss1". When the second control signal controls the driving device DRV5 to turn off the switch S5 and meanwhile controls the driving device DRV6 to turn on the switch S6, a power supply voltage tributary where Vcc2 is located and a power supply voltage tributary where Vss1 is located are both changed into a path, and at this time, the voltage range of the linear amplifier 111 is "Vcc2-Vss1". The rest can be deduced in the same manner. Definitely, in order to prevent straight-through among different voltages, each power supply voltage switching tributary includes one diode, such as D5, D6, D7 and D8 in FIG. 8.

Figure 9:
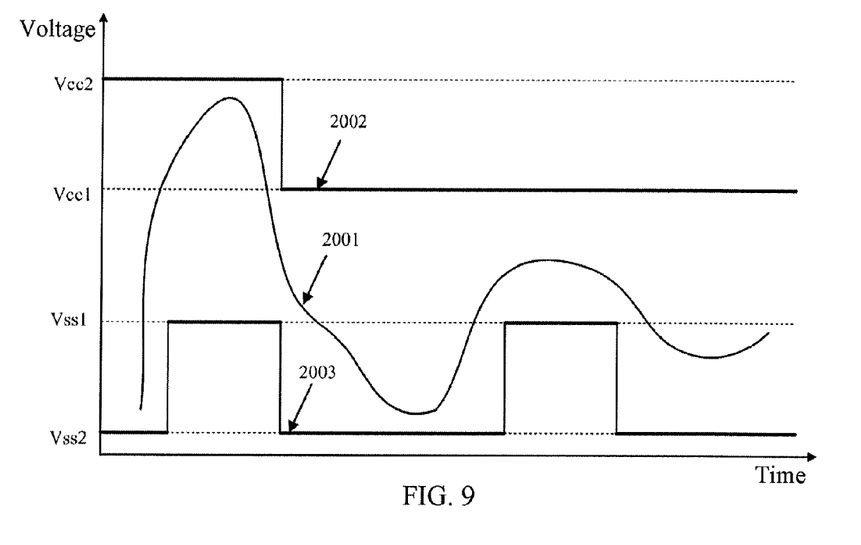
FIG. 9 is a voltage curve diagram of each unit in the fast tracking power supply according to Embodiment 5.

Referring to FIG. 9, a waveform of a voltage output by the combined controllable voltage source 11 is shown by a curve 2001, a Vcc voltage provided by the power supply voltage switching unit 112 is shown by a curve 2002, and a Vss voltage provided by the power supply voltage switching unit 112 is shown by a curve 2003.

To sum up, through the switching of Vcc and Vss at the same time performed by the power supply voltage switching unit 112, the power supply voltage range of the linear amplifier 111 may be dynamically decreased, that is, the values of Vcc-Vss are reduced, thereby reducing the output efficiency of the linear amplifier and improving the switching efficiency of the device. Moreover, because the power supply voltage range of the linear amplifier 111 is decreased, the linear amplifier 111 may further implement a higher tracking bandwidth.

It should be noted that, the composition form of the power supply voltage switching unit 112 is not unique, and may also be implemented through other circuits with similar functions or integrated devices with corresponding functions in the actual applications, for example, the MOSFET may also be replaced by devices such as a triode, which is not limited herein. In addition, the number of the voltage sources may be adjusted according to requirements in the actual applications, that is, in the actual applications, multiple voltage sources and multiple switching circuits may be used to implement switching among more voltage rails.

Embodiment 6

Figure 10:
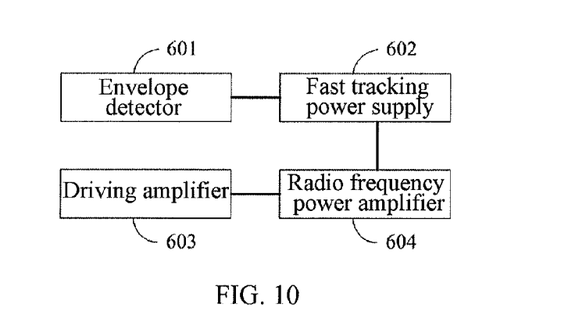
FIG. 10 is a schematic structural diagram of a communication system according to an embodiment.

Correspondingly, an embodiment further provides a communication system. As shown in FIG. 10, the communication system includes an envelope detector 601, a driving amplifier 603, a radio frequency power amplifier 604 and any one of the fast tracking power supplies 602 provided by the embodiments.

The envelope detector 601 is configured to detect a radio frequency signal, extract an envelope signal from the radio frequency signal, use the extracted envelope signal as a reference signal, and provide the reference signal to the fast tracking power supply 602.

The fast tracking power supply 602 is configured to receive the envelope signal extracted by the envelope detector 601, and provide a drain voltage and current for the radio frequency power amplifier 604 according to the envelope signal. For details, refer to the above embodiments.

The driving amplifier 603 is configured to receive the radio frequency signal, and perform driving amplification on the radio frequency signal.

The radio frequency power amplifier 604 is configured to receive the radio frequency signal that has undergone the driving amplification performed by the driving amplifier 603 and amplify the radio frequency signal.

Figure 11:
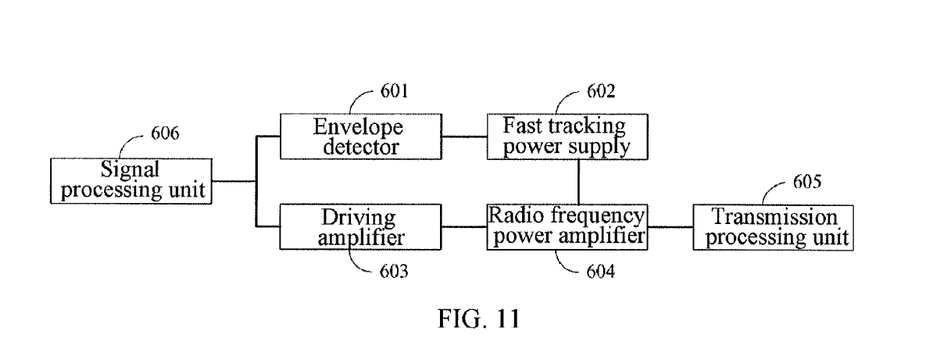
FIG. 11 is another schematic structural diagram of a communication system according to an embodiment.
Figure 12:
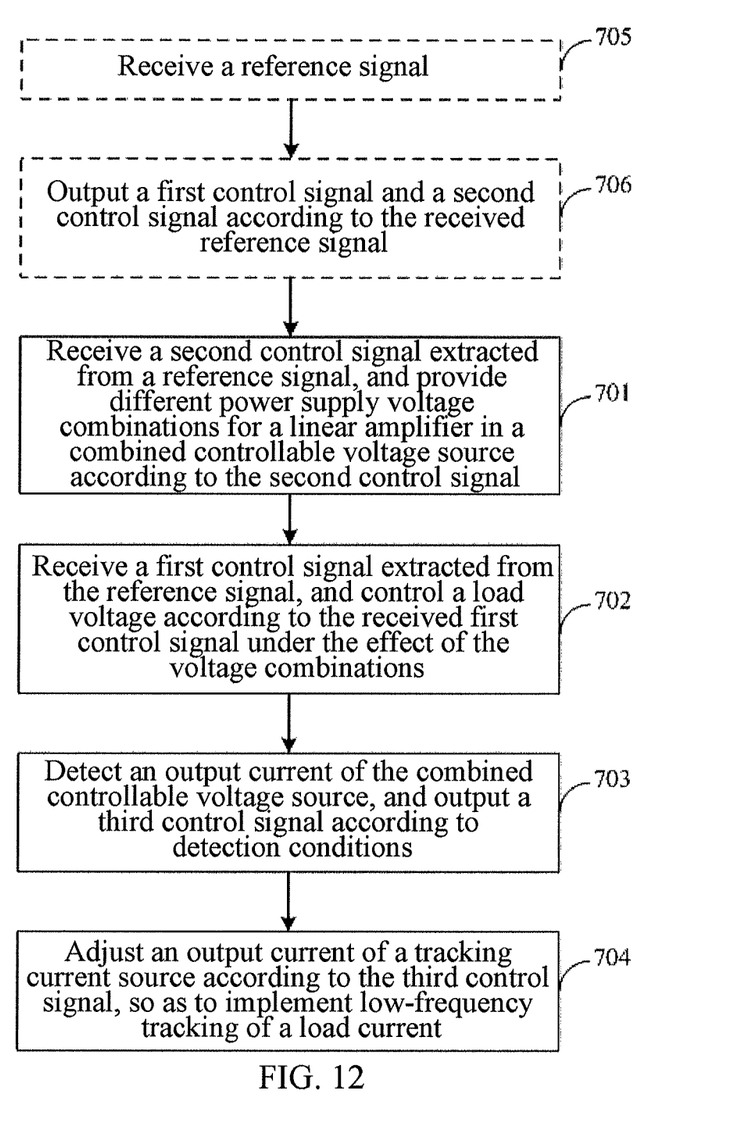
FIG. 12 is a flow chart of a method for controlling a fast tracking power supply according to an embodiment.

As shown in FIG. 11, the communication system may further include a transmission processing unit 605.

The transmission processing unit 605 is configured to process the radio frequency signal that has undergone the amplification performed by the radio frequency power amplifier 604.

As shown in FIG. 11, the communication system may further include a signal processing unit 606.

The signal processing unit 606 is configured to process the radio frequency signal, and send the processed radio frequency signal to the envelope detector 601 and the driving amplifier 603.

It can be seen from the above embodiments that, in the fast tracking power supply 602 in the communication system, the tracking current source 13 provides a large part of the current for the radio frequency power amplifier 604, so as to implement high-efficiency low-frequency tracking of the current of the radio frequency power amplifier 604. Meanwhile, the combined controllable voltage source 11 controls a drain voltage of the radio frequency power amplifier 604, and the output power of the linear amplifier 111 with the feature of low efficiency and high precision is reduced by adjusting the power supply voltage range of the linear amplifier 111, so that the power consumption is reduced because of the low output efficiency of the linear amplifier 111, thereby improving the whole switching efficiency of the fast tracking power supply. Moreover, because the power supply voltage range of the linear amplifier 111 is decreased, the linear amplifier 111 may further implement a higher tracking bandwidth. Because the whole efficiency of the fast tracking power supply 602 is improved, the efficiency of the communication system is also improved.

Embodiment 7

Correspondingly, an embodiment further provides a method for controlling a fast tracking power supply. Referring to FIG. 11, the method includes the following steps:

Step 701: Receive a second control signal extracted from a reference signal, and provide different power supply voltage combinations for a linear amplifier in a combined controllable voltage source according to the second control signal.

In this way, a power supply voltage range of the linear amplifier 111 is not required to cover the whole voltage range, but remains in a small power supply voltage range. Because a current of the linear amplifier is low, if the covered power supply voltage range is reduced, the power consumption of the linear amplifier may also be reduced, that is, the power consumption of the combined controllable voltage source is reduced.

Step 702: Receive a first control signal extracted from the reference signal, and control a load voltage according to the received first control signal under the effect of the voltage combinations.

Step 703: Detect an output current of the combined controllable voltage source, and output a third control signal according to detection conditions.

For example, the output current of the combined controllable voltage source is detected. When it is detected that the output current of the combined controllable voltage source is increased, a third control signal instructing to increase the output current of a tracking current source is output; and when it is detected that the output current of the combined controllable voltage source is decreased, a third control signal instructing to reduce the output current of the tracking current source is output.

Step 704: Adjust the output current of the tracking current source according to the third control signal, so as to implement high-efficiency low-frequency tracking of a load current.

For example, if the third control signal instructing to increase the output current of the tracking current source is received, increase the output current of the tracking current source; and if the third control signal instructing to reduce the output current of the tracking current source is received, reduce the output current of the tracking current source.

Optionally, before step 701, the method for controlling the fast tracking power supply may further include steps 705 and 706.

Step 705: Receive a reference signal, where an envelope signal used as the reference signal may be specifically an analog signal or a digital signal.

It should be noted that, because the type of the input signal of the liner amplifier is an analog signal, it is further required to convert a digital signal into the analog signal if the input signal is the digital signal.

Step 706: Output a first control signal and a second control signal according to the received reference signal.

Optionally, to ensure that each unit outputs the signals that match with other in the aspect of time so as to obtain correct output signals after superposition, delay matching may further be performed on the first control signal and the second control signal.

For the details of the above steps, refer to the above embodiments and the details.

It can be seen from the above that, in this embodiment, the tracking current source with the feature of high efficiency and low precision is controlled to provide a large part of the current for the load according to the third control signal, so as to implement high-efficiency low-frequency tracking of the load current. Meanwhile, the combined controllable voltage source is controlled to provide the voltage for the load according to the first control signal, and the output power of the linear amplifier with the feature of low efficiency and high precision is reduced by adjusting a power supply voltage range of the linear amplifier according to the second control signal, so that the power consumption is reduced because of the low output efficiency of the linear amplifier, thereby improving the whole switching efficiency of the fast tracking power supply. Moreover, because the power supply voltage range of the linear amplifier is decreased, the linear amplifier may further implement a higher tracking bandwidth.

To sum up, through the solution, the whole power amplification efficiency of the fast tracking power supply is improved at the same time when it is ensured to output a high-bandwidth and high-precision signal.

Persons of ordinary skill in the art should understand that all or a part of the steps of the method according to the embodiments may be implemented by a program instructing relevant hardware. The program may be stored in a computer readable storage medium, such as a read only memory (ROM, Read Only Memory), a random access memory (RAM, Random Access Memory), a magnetic disk or an optical disk.

The method for controlling a fast tracking power supply, the fast tracking power supply, and the system are described in detail above. The principle and implementation are described herein through specific examples. The description about the embodiments is merely provided for ease of understanding of the method and core ideas, and should not be construed as a limitation on the claims. Persons of ordinary skill in the art can make variations and modifications to the specific implementations provided herein. Such adapted implementations are understood to fall within the scope of the claims.

What is claimed is:

1. A fast tracking power supply, comprising:
a controllable voltage source that comprises a linear amplifier and a power supply voltage switching unit;
a current detection unit; and
a tracking current source, wherein:
the linear amplifier is configured to receive a first control signal that is based on a reference signal, and to control a load voltage according to the received first control signal;
the power supply voltage switching unit is configured to receive a second control signal based on the reference signal that is different from the first control signal, and to provide one of a plurality of discrete voltages as a voltage source for the linear amplifier according to the second control signal;
the current detection unit is configured to detect an output current of the combined controllable voltage source, and to output a third control signal according to a detection result; and the tracking current source is configured to receive the third control signal output by the current detection unit, and adjust an output current of the tracking current source according to the third control signal, so as to implement low-frequency tracking of a load current, wherein the controllable voltage source is connected to the current detection unit in series and then connected to the tracking current source in parallel to provide a current.

2. The fast tracking power supply according to claim 1, wherein:
the power supply voltage switching unit comprises a level selection branch and at least two voltage sources with different voltage values;
the voltage source is configured to provide a voltage; and
the level selection branch is configured to receive the second control signal, and to select the voltage source according to the received second control signal, so as to provide a power supply voltage for the linear amplifier.

3. The fast tracking power supply according to claim 2, wherein the level selection branch comprises
a driving device;
a switch device; and
a diode, wherein:
the driving device is configured to receive the second control signal, select the voltage source according to the received second control signal, and to drive the switch device to perform switching;
the switch device is configured to perform the switching among the voltage sources; and
the diode is configured to provide isolation among different voltages and provide reverse prevention.

4. The fast tracking power supply according to claim 1, wherein the current detection unit is configured to:
determine an output current of the controllable voltage source
when the current detection unit determines that the output current of the combined controllable voltage source has increased, the current detection unit outputs a third control signal that controls the tracking current source to increase output current; and
when the current detection unit determines that the output current of the combined controllable voltage source has decreased, the current detection unit outputs a third control signal that controls the tracking current source to reduce output current;
wherein the tracking current source increases and reduces the tracking current source output current according to the third control signal.

5. The fast tracking power supply according to claim 1, wherein
the tracking current source is formed by a BUCK circuit, a BOOST circuit, a BUCK-BOOST circuit, or a CUK circuit.

6. The fast tracking power supply according to claim 5, wherein
the control unit is further configured to perform delay matching on the first control signal and the second control signal.

7. The fast tracking power supply according to claim 1, further comprising a control unit, wherein the control unit is configured to receive a reference signal, output a first control signal to the power supply voltage switching unit, and output a second control signal to the linear amplifier according to the reference signal.

8. The method according to claim 1, wherein the power supply voltage switching unit is configured to generate a second plurality of discrete voltages, wherein the first plurality of discrete voltages are applied to a positive power rail of the linear amplifier and the second plurality of discrete voltages are applied to a negative power rail of the linear amplifier.

9. A communication system, comprising:
an envelope detector;
a driving amplifier;
a radio frequency power amplifier; and
a fast tracking power supply according to claim 1, wherein;
the envelope detector is configured to detect a radio frequency signal, extract an envelope signal from the radio frequency signal, use the envelope signal as a reference signal, and to provide the reference signal to the fast tracking power supply;
the fast tracking power supply is configured to receive the envelope signal extracted by the envelope detector, and to provide a drain voltage and current for the radio frequency power amplifier according to the envelope signal, wherein the fast tracking power supply includes a switch mode power supply and a linear amplifier, wherein the switch mode power supply provides one of a plurality of discrete voltages as a voltage source for the linear amplifier;
the driving amplifier is configured to receive the radio frequency signal, and to perform driving amplification on the radio frequency signal; and
the radio frequency power amplifier is configured to receive the radio frequency signal that has undergone the driving amplification performed by the driving amplifier and amplify the radio frequency signal.

10. The communication system according to claim 9, further comprising a transmission processing unit, wherein
the transmission processing unit is configured to process the radio frequency signal that has undergone the amplification performed by the radio frequency power amplifier.

11. The communication system according to claim 9, wherein:
the power supply voltage switching unit comprises a level selection branch and at least two voltage sources with different voltage values;
the voltage source is configured to provide a voltage; and
the level selection branch is configured to receive the second control signal, and to select the voltage source according to the received second control signal, so as to provide a power supply voltage for the linear amplifier.

12. The communication system according to claim 11, wherein:
the level selection branch comprises a driving device, a switch device and a diode;
the driving device is configured to receive the second control signal, select the voltage source according to the received second control signal, and to drive the switch device to perform switching;
the switch device is configured to perform the switching among the voltage sources; and
the diode is configured to provide isolation among different voltages and provide reverse prevention.

13. The communication system according to claim 9, wherein
the current detection unit is configured to detect an output current of the combined controllable voltage source and to control the tracking current source via a third control signal,
when the current detection unit determines that the output current of the combined controllable voltage source has increased, the third control signal of the current detection unit controls the tracking current source to increase output current;

when the current detection unit determines that the output current of the combined controllable voltage source has decreased, the third control signal of the current detection unit controls the tracking current source to decrease output current; and the tracking current source is configured to increase and decrease the output according to the third control signal.

14. The communication system according to claim 9, wherein
the tracking current source is formed by a BUCK circuit, a BOOST circuit, a BUCK-BOOST circuit, or a CUK circuit.

15. The communication system according to claim 9, wherein
the control unit is further configured to perform delay matching on the first control signal and the second control signal.

16. The communication system according to claim 14, further comprising a control unit, wherein the control unit is configured to receive a reference signal, output a first control signal to the power supply voltage switching unit and output a second control signal to the linear amplifier according to the reference signal.

17. A method for controlling a fast tracking power supply, comprising:
receiving a first control signal extracted from a reference signal;
providing one of a plurality of discrete voltages as a voltage source for a linear amplifier in a combined controllable voltage source according to the second control signal;
receiving a second control signal extracted from the reference signal, wherein the second control signal is different from the first control signal;
providing a voltage for a load according to the received second control signal under the effect of the voltage combinations;
detecting an output current of the combined controllable voltage source;
outputting a third control signal according to detection conditions; and
adjusting an output current of a tracking current source according to the third control signal, so as to implement low-frequency tracking of a load current.

18. The method for controlling the fast tracking power supply according to claim 17, wherein
detection of the output current of the combined controllable voltage source and outputting of the third control signal according to the detection conditions comprises:
detecting an output current of the combined controllable voltage source;
when determining that the output current of the combined controllable voltage source has increased, controlling, via a third control signal, the tracking current source to increase output current; and
when determining that the output current of the combined controllable voltage source has decreased, controlling, via the third control signal the tracking current source to reduce output current; and
adjusting, by tracking current source, the output current according to the third control signal.

19. The method for controlling the fast tracking power supply according to claim 17, further comprising:
receiving the reference signal; and
outputting the first control signal and the second control signal according to the reference signal.

20. The method for controlling the fast tracking power supply according to claim 17, further comprising:
performing delay matching on the first control signal and the second control signal.

* * * * *